United States Patent [19]
Tomita et al.

[11] Patent Number: 6,075,393
[45] Date of Patent: Jun. 13, 2000

[54] CLOCK SYNCHRONOUS SEMICONDUCTOR DEVICE SYSTEM AND SEMICONDUCTOR DEVICES USED WITH THE SAME

[75] Inventors: Hiroyoshi Tomita; Yoshihiro Takemae, both of Kawasaki, Japan

[73] Assignee: Fujitsu Limited, Kawasaki, Japan

[21] Appl. No.: 08/998,478

[22] Filed: Dec. 29, 1997

[30] Foreign Application Priority Data

Jul. 22, 1997 [JP] Japan ..................................... 9-196059

[51] Int. Cl.[7] ...................................................... H03L 7/00
[52] U.S. Cl. .................... 327/153; 327/161; 365/189.01; 365/194; 375/354
[58] Field of Search .................................... 327/155, 161, 327/153; 365/189.01, 189.07, 233, 194; 375/354, 371

[56] References Cited

U.S. PATENT DOCUMENTS

| 5,706,234 | 1/1998 | Pilch, Jr. et al. ........................ 365/201 |
| 5,717,729 | 2/1998 | Iknaian et al. ............................ 375/356 |
| 5,822,254 | 10/1998 | Koshikawa et al. ................ 365/189.05 |
| 5,835,424 | 11/1998 | Kikukawa et al. ..................... 365/200 |

*Primary Examiner*—Tim Callahan
*Assistant Examiner*—Hai L. Nguyen
*Attorney, Agent, or Firm*—Arent Fox Kintner Plotkin & Kahn, PLLC

[57] ABSTRACT

A clock synchronous semiconductor device system and semiconductor devices used with the system have the read and write operations performed at a proper timing without increasing the types of clock or the amount of wiring. The system includes a plurality of semiconductor devices operated in synchronism with a clock. One of the semiconductor devices operates as a controller for producing a signal related to the controlling of the remaining semiconductor devices. A clock signal line for transmitting a clock to each semiconductor device is arranged in parallel with the other signal lines. A clock source is arranged at a position far from the controller not to cause any skew when the read data arrive at the controller from the remaining semiconductor devices. The timing at which each memory retrieves the write data from the controller is adjusted by an input timing adjusting circuit included in each memory, thereby permitting each memory to retrieve the write data at an optimum timing.

14 Claims, 15 Drawing Sheets

CLOCK SYNCHRONOUS SEMICONDUCTOR DEVICE SYSTEM AND SEMICONDUCTOR DEVICES USED WITH THE SAME

BACKGROUND THE INVENTION

1. Field of the Invention

The present invention relates to a semiconductor device system configured of semiconductor devices operating in synchronism with a clock or, in particular, to a semiconductor memory system using synchronous memories for retrieving an input signal at a predetermined timing regardless of fluctuations in ambient temperature or in source voltage by adjusting the timing of the clock.

2. Description of the Related Art

In a large-scale semiconductor device system such as a computer using semiconductor devices, various parts thereof are configured to operate in synchronism with a clock, and signals such as data signals and address signals are input and output in synchronism with a clock signal. In recent years, the increased speed of the CPU clock and the processing speed of various other electronic circuits has made it necessary to increase the operating speed of the interfaces connecting the semiconductor devices. An SDRAM is a semiconductor device intended to meet such a demand for higher speed, and can be used at a very high access rate when accessing continuous addresses. The result is that signals on the data bus undergo a change in very short cycles, and it is necessary to retrieve the data bus signals at high speed.

In a memory system, the clock, the commands, the address signals and the write data output from a controller are transmitted along signal lines arranged in parallel with each other. Therefore, the phase relationship between the signals output from the controller is considered to be maintained when the signals are received by a memory. The memories thus could retrieve the other signals at a normal timing in synchronism with the received clock. When reading the data stored in a memory, the data read from inside the memory based on the command and the address signal retrieved are output by the memory in synchronism with the clock. The read data and the clock, however, are transmitted in opposite directions, so that the read data and the clock are considerably displaced from each other when they reach the controller. In addition, the amount of displacement depends on the particular memory from which the data are read.

In the case where a semiconductor device retrieves an input signal, a period when the input signal is required to be established is predetermined before and after the timing of retrieval. The period before the retrieval timing when the input signal is required to be established is called a set-up time, and the period after the retrieval timing when the input signal is required to be established is called a hold time. In the case where the data transfer rate is low with a long data transition period, the above-mentioned displacement, if any, poses no serious problem in view of the fact that a sufficiently long set-up time and hold time can be secured. Suppose, for example, that the signal advances at the rate of about 30 cm per 1 ns. If the signal line between a controller and a memory is 30 cm long, a skew (displacement) of about 2 ns develops. In the case where the clock is 50 MHz and data changes for every clock period, the data transition period is 20 ns, so that a skew of up to about 2 ns can normally be overcome. If the data transition period is further shortened, however, the resulting skew cannot be neglected.

The problem of displacement of the read data in the controller can be solved by arranging a clock source far from a controller and by transmitting the clock along the clock signal line in the same direction as the read data is transmitted to the controller. Nevertheless, a new problem arises that the write data output from the controller is displaced from the clock in each memory. In view of this, this configuration further includes a write clock signal line for transmitting the write clock in the direction away from the controller, wherein the controller generates a write data from a read data and applies it to the write clock signal line. In this way, the read data arriving at the controller from the memory is synchronized with the the read clock, and the write data and other signals arriving at the memory from the controller are synchronized with the write clock. The result is that the controller can retrieve the read data in synchronism with the read clock, and the memory can retrieve the write data in synchronism with the write clock, thus reducing the displacement and making possible a high-speed data transfer.

In this system, the controller can retrieve the read data and the memory can retrieve the write data at a proper timing. However, two clock signal lines for the write and read operations are required, resulting in an increased size of the chip set constituting the controller and an increased number of memory terminals for a larger wiring space.

SUMMARY OF THE INVENTION

The present invention is intended to solve these problems, and the object thereof is to provide a semiconductor device system in which a controller can retrieve the read data and each memory can retrieve the write data at a proper timing without increasing the number of types of clocks.

In order to achieve the above-mentioned object, according to the present invention, there is provided a semiconductor device system, wherein a clock source is arranged far from a controller (drive-side semiconductor device) so that no skew may develop when the data read from any one of the memories (receive-side semiconductor devices) arrives at the controller, and wherein the timing at which each memory retrieves the write data from the controller is adjusted by an input timing adjusting circuit included in the particular memory, thereby making it possible for the memory to retrieve the write data at S an optimum timing.

Specifically, a semiconductor device system according to the present invention comprises a plurality of semiconductor devices operating in synchronism with a clock, one of the semiconductor devices being operated as a drive-side semiconductor device for outputting a signal related to the control of the other semiconductor devices (receive-side semiconductor devices), wherein a clock signal line for transmitting a clock to each semiconductor device is arranged in parallel with the other signal lines, the clock being transmitted toward the drive-side semiconductor device along the clock signal line, wherein the drive-side semiconductor device includes an input circuit for retrieving the signals from the semiconductor devices other than the drive-side semiconductor device in synchronism with the clock and an output circuit for producing an output signal in synchronism with the clock, and wherein the semiconductor devices other than the drive-side semiconductor device each include an output circuit for producing an output signal in synchronism with the clock, an input circuit for retrieving the signal from the drive-side semiconductor device and an input timing adjusting circuit for adjusting the retrieval timing of the input circuit.

A method is conceivable for retrieving an input signal at an optimum timing even in the case where there is a skew between the clock and an input signal consists in adding an input timing adjusting circuit for adjusting the retrieval timing of an input circuit. According to the present invention, such an input timing adjusting circuit is inserted in each memory (receive-side semiconductor device) in order to adjust the retrieval of the write data by the memory from the controller at an optimum timing. This makes possible the retrieval at an optimum timing of both the read data by the controller and the write data by the memory. The input timing adjusting circuit includes, for example, a delay circuit for producing an input timing clock delayed from an internal clock generated based on the received clock and having a selectable delay amount, a phase comparator circuit for judging the phase relation between the input timing clock and the input signal, and a delay control circuit for changing the delay amount of the delay circuit in such a manner as to assure a predetermined phase of the input timing clock with respect to the input signal on the basis of the judgement at the phase comparator circuit.

Also, in view of the fact that normal retrieval of the write data is impossible before complete timing adjustment at the input timing adjusting circuit, the semiconductor device system is required to be set in a receive timing adjust mode for adjusting the input timing adjusting circuit for a predetermined time after being activated, followed by entering a normal operation mode. Even after the normal operation mode is entered, the optimum timing may change and therefore, the input timing adjusting circuit is preferably adjusted.

Further, in the case where the input signal undergoes a change at high rate, the manner in which the input signal changes is varied depending on the signal pattern. The adjustment of the input timing adjusting circuit, therefore, is preferably performed with the same input signal pattern. For this reason, the input timing adjusting circuit includes a pattern judging circuit for judging that the input signal has a predetermined pattern so that the retrieval timing of the input circuit is adjusted when the input signal assumes a predetermined pattern. In the case where a receive timing adjust mode is provided as described above, the controller (drive-side semiconductor device) produces the predetermined pattern signal successively in the receive timing adjust mode in order to complete the adjustment in a short time.

The semiconductor device system is used by connecting a multiplicity of memories to a single controller. In order to indicate which one of the memories which is accessed, an address signal is decoded to generate a chip select signal, which is applied to a chip select (/CS) terminal of the memory to be accessed. The memory to which the chip select signal is applied retrieves the control signal and the address signal applied thereto. In a write operation, the memory further retrieves the write data and performs the writing process, while in a read operation, the memory outputs the read data by performing the corresponding appropriate process. The memories to which the chip select signal is not applied, however, perform no processing. In the conventional system in which each memory includes an input timing adjusting circuit, the input timing adjusting circuit is not adjusted in the absence of a chip select signal. In the receive timing adjust mode, therefore, the memories are selected sequentially and the input timings of the respective memories are adjusted. This poses the problem of a longer time required for adjustment. In normal operation mode, on the other hand, the input timing to a given memory is liable to be displaced after the particular memory is not accessed for a long time. According to this invention, the input timing adjusting circuit and the circuits required for performing the operation in the input timing adjusting circuit are kept active, while the input signal is not transmitted to the internal circuit described above, even in the absence of an input select signal.

The above-mentioned memories (receive-side semiconductor devices) constituting the semiconductor device system are each required to include a clock input circuit for receiving the clock, an output circuit for producing an output signal in synchronism with the clock, an input signal for retrieving an input signal, and an input timing adjusting circuit for adjusting the timing of retrieval of the input circuit. For this purpose, an input timing adjusting circuit is provided for each input signal, so that an input signal can be retrieved at an optimum timing even in the presence of a skew between input signals. This invention is applicable to a configuration including an input timing adjusting circuit for each input signal. In the case where a receive timing adjust mode is set and the normal operation mode is entered after complete adjustment, all the input timing adjusting circuits must be adjusted in the receive timing adjust mode. The problem encountered in this case is that power consumption increases if the input timing adjusting circuits continue to be operated after complete adjustment. In the presence of a skew between input signals, the input timing, after being adjusted in receive timing adjust mode, is considered to change in the same manner as before adjustment. In the case where the input timing adjusting circuit is provided for each input signal, therefore, a switch is included in a part of the input timing adjusting circuits for selecting, as the judgement supplied to the delay control circuit, between the judgement output from the phase comparator circuit of the same input timing adjusting circuit and the judgement output from the phase comparator circuit of another input timing adjusting circuit. In this way, the switch is operated in such a manner that the delay control circuit is supplied with the judgement output from the phase comparator circuit of the same input timing adjusting circuit in receive timing adjust mode and with the judgement output from the phase comparator circuit of another input timing adjusting circuit in other than the receive timing adjust mode. Thus, a part of the phase comparator circuits can be deactivated in normal operation mode, thereby reducing the power consumption.

BRIEF DESCRIPTION OF THE DRAWINGS

The present invention will be more clearly understood from the description as set forth below with reference to the accompanying drawings, wherein.

DESCRIPTION OF THE PREFERRED EMBODIMENTS

Before proceeding to a detailed description of the present invention, prior art semiconductor device systems will be described to allow a clearer understanding of the difference between the present invention and the prior art.

Figure 1:
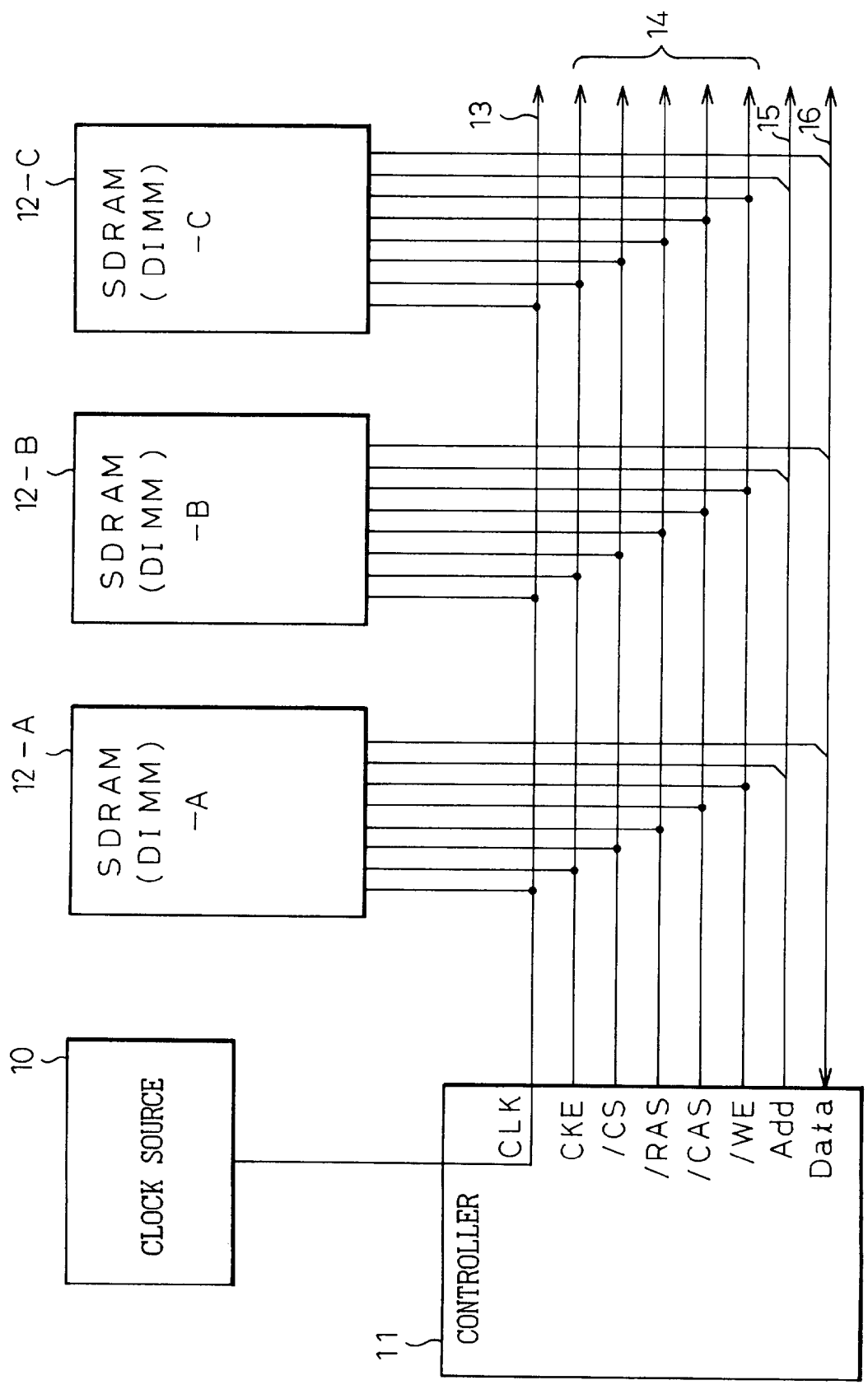
FIG. 1 is a diagram showing an example of a conventional configuration of a semiconductor device system.

FIG. 1 is a diagram showing an example of a conventional configuration of a semiconductor device system. The system shown in FIG. 1 is for controlling the input and output of data to and from a plurality of memories 12-A, 12-B, 12-C by a controller 11. Especially, the diagram of FIG. 1 shows a configuration for writing data into the memories. As shown in FIG. 1, a clock signal line 13, control signal buses 14 for a clock enable signal, /CS, /RAS, /CAS, /WE and the like signals, an address signal bus 15 and a write data bus 16 extending from a controller 11 are arranged in parallel. The memories 12-A, 12-B, 12-C are arranged along the signal line and the buses, and have the terminals thereof connected to the corresponding lines. Although the memories 12-A, 12-B, 12-C are drawn above the signal line and the buses in FIG. 1, each line is actually arranged to pass between the terminals of the memories 12-A, 12-B, 12-C. A clock is supplied all the time from a clock source 10, and the controller 11 applies the clock to the clock signal line 13. Therefore, the clock is transmitted in the direction away from the controller 11. When data is written in the memories, a signal is output from the controller 11 to the control signal bus 14, the address signal bus 15 and the data bus 16 11 in synchronism with the clock. Each memory thus retrieves the clock and generates an internal clock. A memory selected by the /CS signal retrieves the signals from the control bus 14, the address signal bus 15 and the data bus 16 on the basis of the internal clock generated therein, and after performing the required processing, stores the write data output to the data bus. When reading data from the memories, on the other hand, a signal is output from the controller 11 to the control signal bus 14 and the address signal bus 15 in synchronism with the clock in similar fashion. A memory thus selected retrieves the signals from the control signal bus 14 and the address signal bus 15 on the basis of the internal clock generated therein and, after performing the required processing, outputs the read data to the data bus. The controller 11 retrieves the read data output to the data bus. The memories 12-A, 12-B, 12-C as shown in FIG. 1 operate in accordance with the clock supplied from an external source, and are called the synchronous type. A DRAM (dynamic random access memory) of the synchronous type is called a SDRAM. The present invention is primarily associated with the SDRAM, and the description that follows will refer mainly to the SDRAM as an example. Nevertheless, the present invention is not limited to the SDRAM. The present invention is also applicable to a device called DIMM which can be used as a large-capacity semiconductor device containing a plurality of SDRAM chips in a package.

Figure 2:
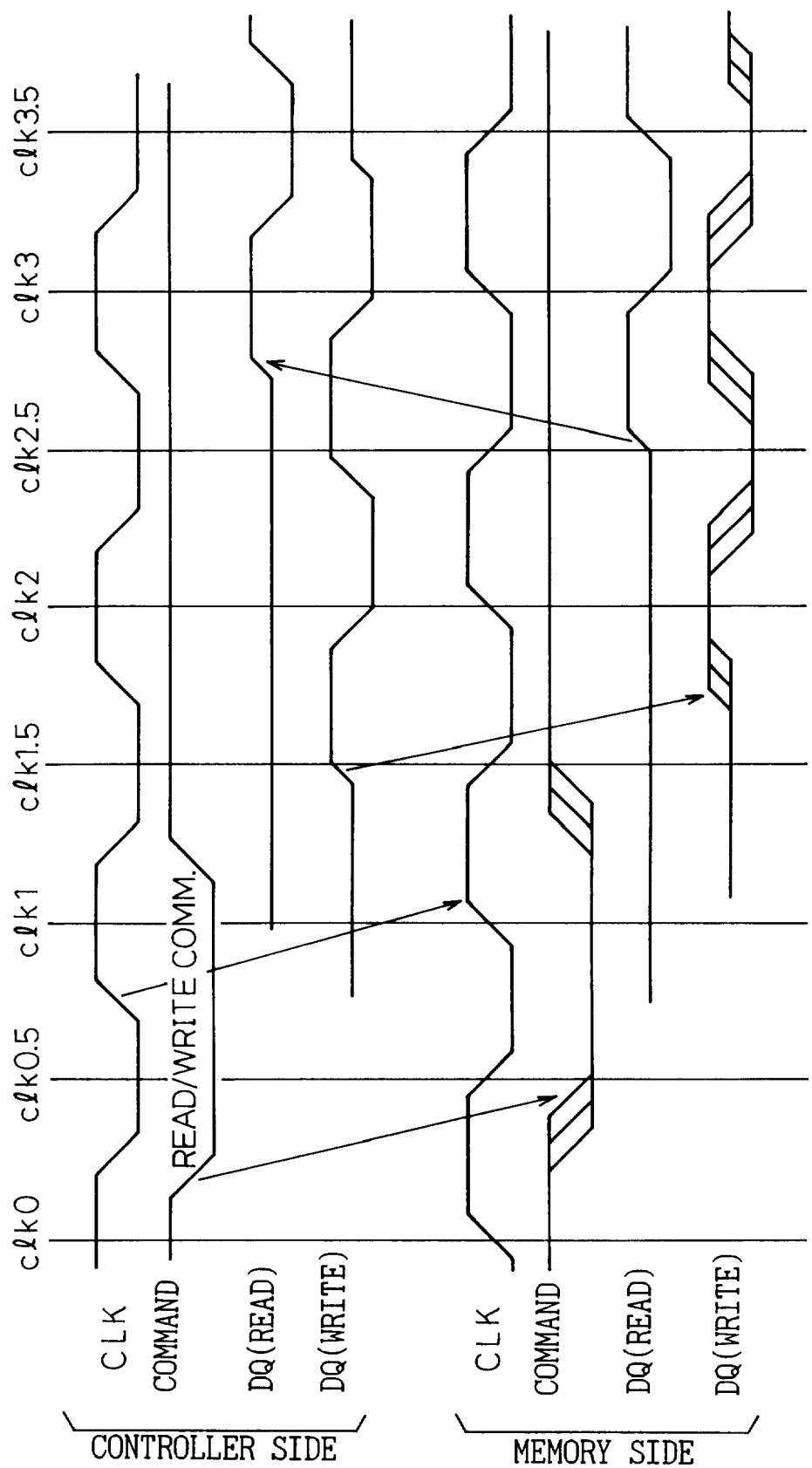
FIG. 2 is a time chart showing the timing of the read/write operation according to the prior art.

FIG. 2 is a diagram showing the timing of the read and write operations in the memory system shown in FIG. 1. The controller 11 changes the signals output to the control signal bus 14 and the address signal bus 15 in synchronism with the trailing edge of the clock CLK. The write data DQ, on the other hand, is output to the data bus at a timing one fourth of a period out of phase with the leading and trailing edges of the clock CLK. A method has come to be used in which the signals other than the data signal change for each period of the clock CLK but the data signal changes for every half period of the clock signal CLK in order to improve the data transfer rate. The description herein also takes this method as an example. The clock, the command, the address signal and the write data output from the controller 11 are transmitted along the signal lines arranged in parallel with each other. The same phase relationship between the signals output from the controller 11, therefore, is considered to be maintained when they are received by the memories. Each memory can thus retrieve the other signals at normal timing in synchronism with the clock received. Specifically, in FIG. 2, for example, the signal is retrieved from the data bus at a timing one fourth of a period out of phase with both the leading and trailing edges of the clock CLK.

When reading data stored in a memory, the data read from inside based on the command and the address signal retrieved in the above-mentioned manner is output by the memory in synchronism with both the leading and trailing edges of the clock CLK. Nevertheless, the read data and the clock CLK are transmitted in opposite directions, and there develops a displacement between the clock CLK and the read data that has arrived at the controller 11. In addition, the size of the displacement is different depending on the memory from which the data is read. Generally, the displacement is twice as much as the time required for transmission between the memory and the controller. In any case, the controller 11 retrieves the read data on the bus in synchronism with the clock CLK at a displaced timing.

Although FIG. 2 shows the case in which the write data is changed at a timing one fourth of a period out of phase with the leading and trailing edges of the clock CLK, the other phases can also be used for changing the write data. The invention, therefore, is not limited to the above-mentioned case.

As described above, in the case where the data transfer rate is low and the data change period is long, the above-mentioned displacement poses no serious problem as a sufficient length of the set-up time and the hold time can be secured. When the data change period is shortened, however, the displacement becomes not negligible. As shown in FIG. 2, in the case where the command signal and the address signal change for the clock period while the data changes for one half of the clock period, a special problem is posed as the data change period is one half of the change period of other signals.

Figure 3:
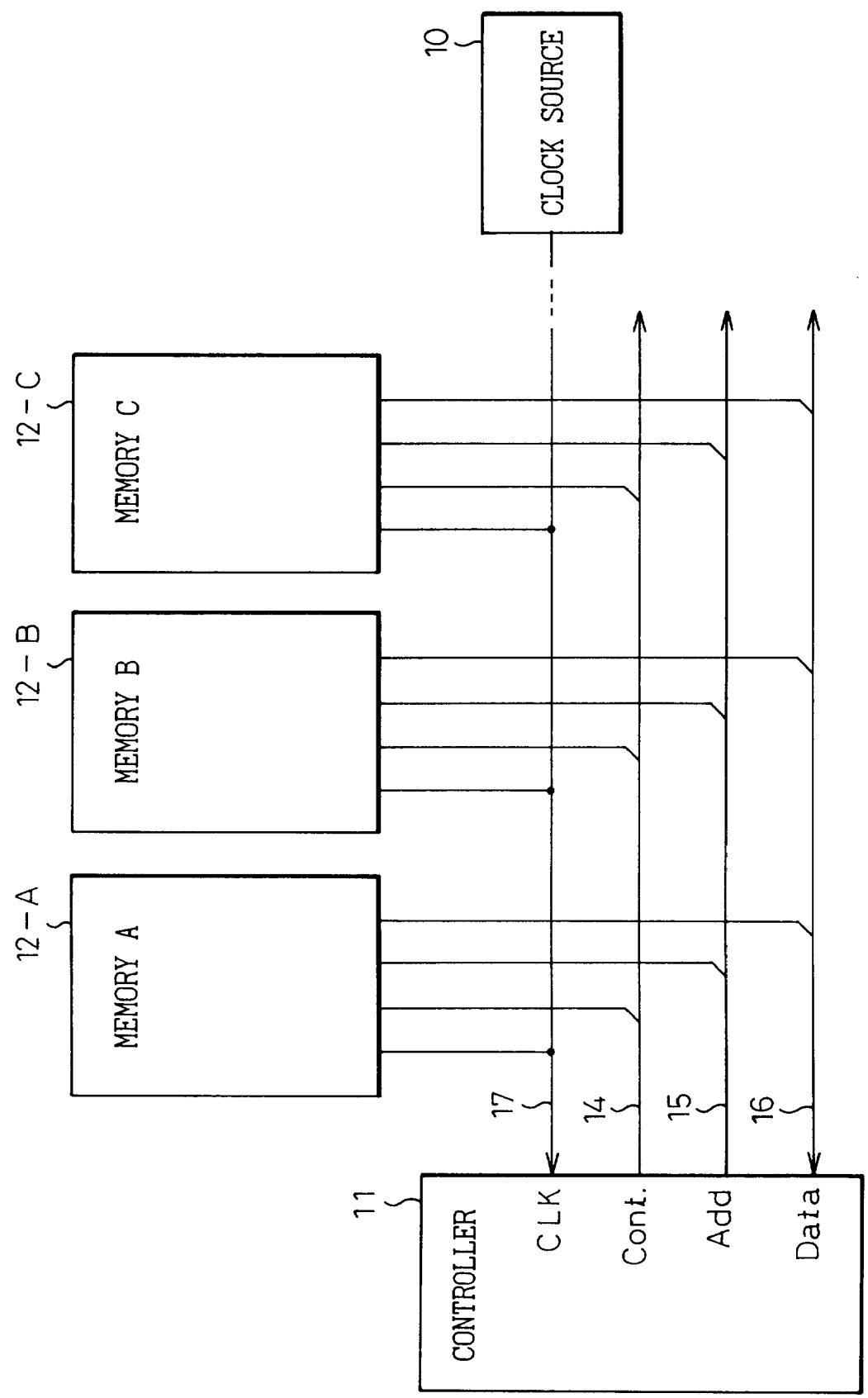
FIG. 3 is a diagram showing another example of a conventional semiconductor device system.
Figure 4:
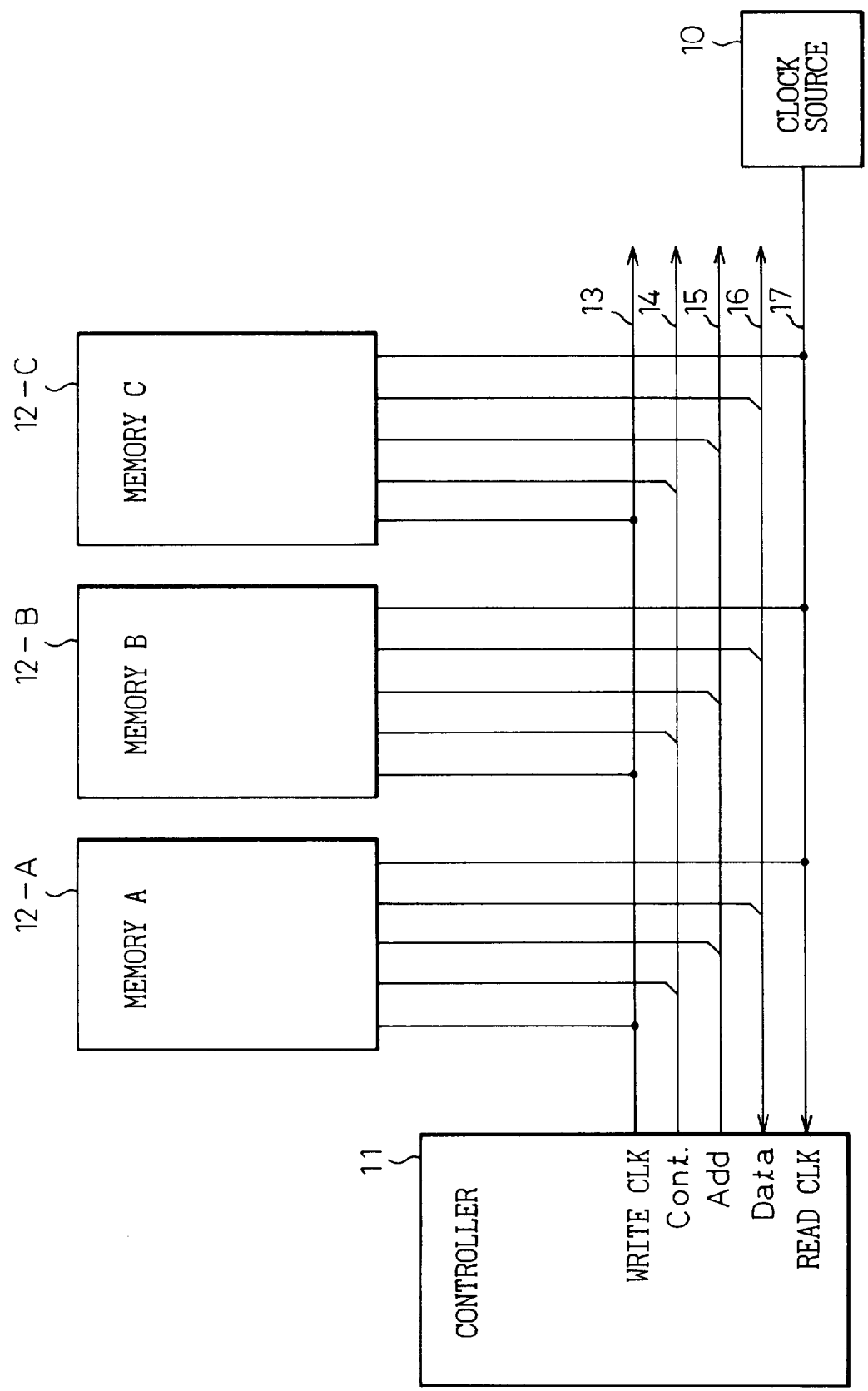
FIG. 4 is a diagram showing still another example of a conventional semiconductor device system.

FIG. 3 is a diagram showing an example of a configuration of a semiconductor device system for solving this problem. As shown, this system has a clock source 10 arranged at a position far from a controller 11, so that the clock is transmitted along the clock signal line 17 in the same direction as the read data is transmitted to the controller 11. This solves the problem of a displaced read data in the controller 11. The configuration shown in FIG. 3, however, poses another problem in that the write data output from the controller 11 is displaced from the clock CLK in each memory. The semiconductor device system having a configuration as shown in FIG. 4 has thus been conceived. The system shown in FIG. 4, like the one in FIG. 3, has a clock source 10 arranged at a point far from the controller 11, and the clock is transmitted along the read clock signal line 17 in the same direction as the read data is transmitted to the controller 11, thus eliminating the displacement of arrival of the read data at the controller 11. At the same time, a write clock signal line 13 is provided for transmitting the write clock in the direction away from the controller 11, in which case the controller 11 generates the write clock CLK from the read clock CLK received and applies it to the write clock signal line 13. As a result, the read data arriving at the controller 11 from the memories are synchronized with the read clock, and the write data and other signals arriving from the controller at each memory are synchronized with the write clock. Consequently, the read data is retrieved by the controller 11 in synchronism with the read clock and the write data is retrieved by each memory in synchronism with the write clock, thus reducing the displacement and increasing the data transfer rate.

In the system shown in FIG. 4, the read data can be retrieved at the controller 11 and the write data are retrieved at each memory both at a proper timing. In spite of this, two clock signal lines are required for write and read operations. As a result, the size of the chip set making up the controller and the memory terminals is increased, while, at the same time, the wiring space is increased.

Figure 5:
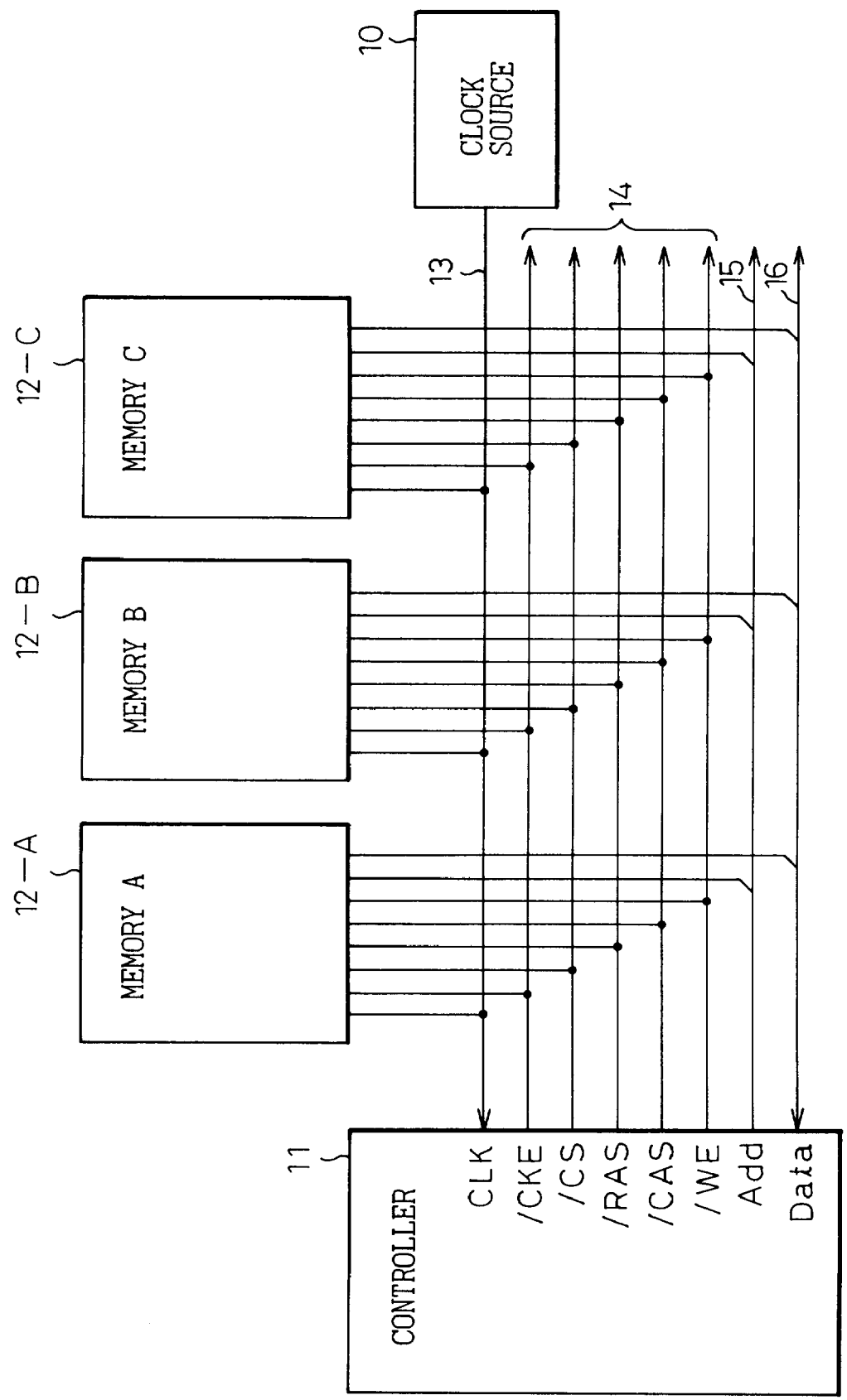
FIG. 5 is a diagram showing a general configuration of a semiconductor device system according to an embodiment.

FIG. 5 is a diagram showing a general configuration of a semiconductor device system according to an embodiment of the present invention. As in FIG. 3, a clock source 10 is arranged at a point far from a controller 11, and the clock is transmitted along a clock signal line 17 in the same direction as the read data are transmitted to the controller 11 from memories 12-A, 12-B, 12-C. In the case where the read data is output in synchronism with the clock by each memory, the problem of the displacement of the read data at the controller 11 is solved. Further, this embodiment is different from the configuration of FIG. 3 in that the memories 12-A, 12-B, 12-C each have an input timing adjusting circuit.

Figure 6:
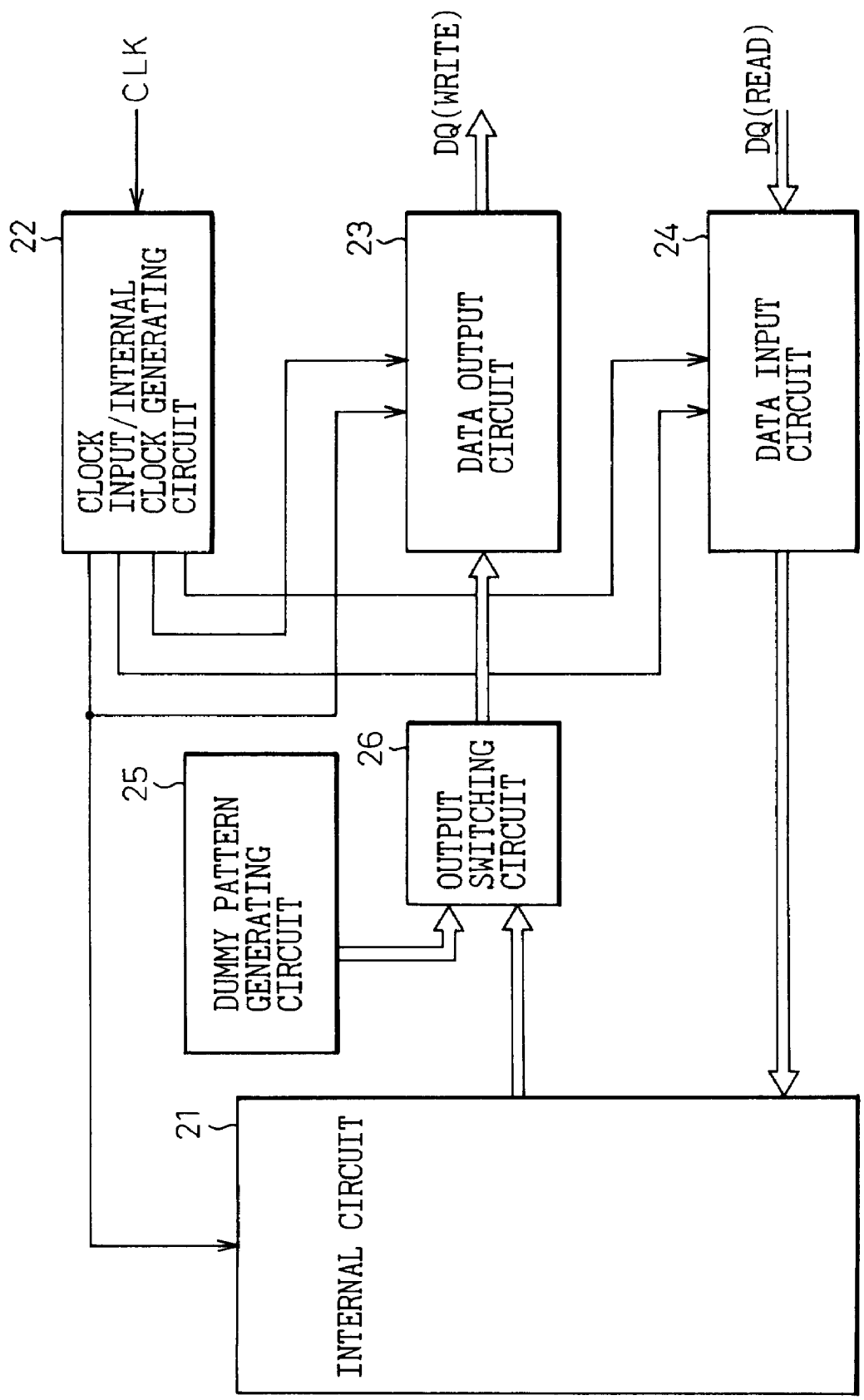
FIG. 6 is a diagram showing a configuration of a controller according to an embodiment.

First, the configuration of the controller 11 will be explained. FIG. 6 is a diagram showing a configuration of the controller 11 according to this embodiment. Normally, this controller 11 is realized as a chip set for constructing a memory system. As shown in FIG. 6, the controller 11 includes an internal circuit 21, a clock input/internal clock generating circuit 22 for receiving the clock CLK input from the clock signal line 13 and generating the internal clock used in the controller, a data output circuit 23 for outputting the write data written in each memory to the data signal line 16, a data input circuit 24 for retrieving the read data output from each memory to the data signal line 16, a dummy pattern generating circuit 25 for generating a predetermined dummy pattern in the input timing adjust mode, and an output switching circuit 26 for performing a switching operation in such a manner that a predetermined dummy data pattern output from the dummy pattern generating circuit 25 is produced from the data output circuit 23 in the input timing adjust mode and the write data output by the internal circuit 21 is produced from the data output circuit 23 in the normal operation mode. In addition, an output circuit is provided for producing a command signal and an address signal. Such an output circuit is not shown, however, since signals other than the data signal are not subjected to input timing adjustment. The data output circuit 23 and the data input circuit 24 use the same configuration as the conventional ones.

Figure 7:
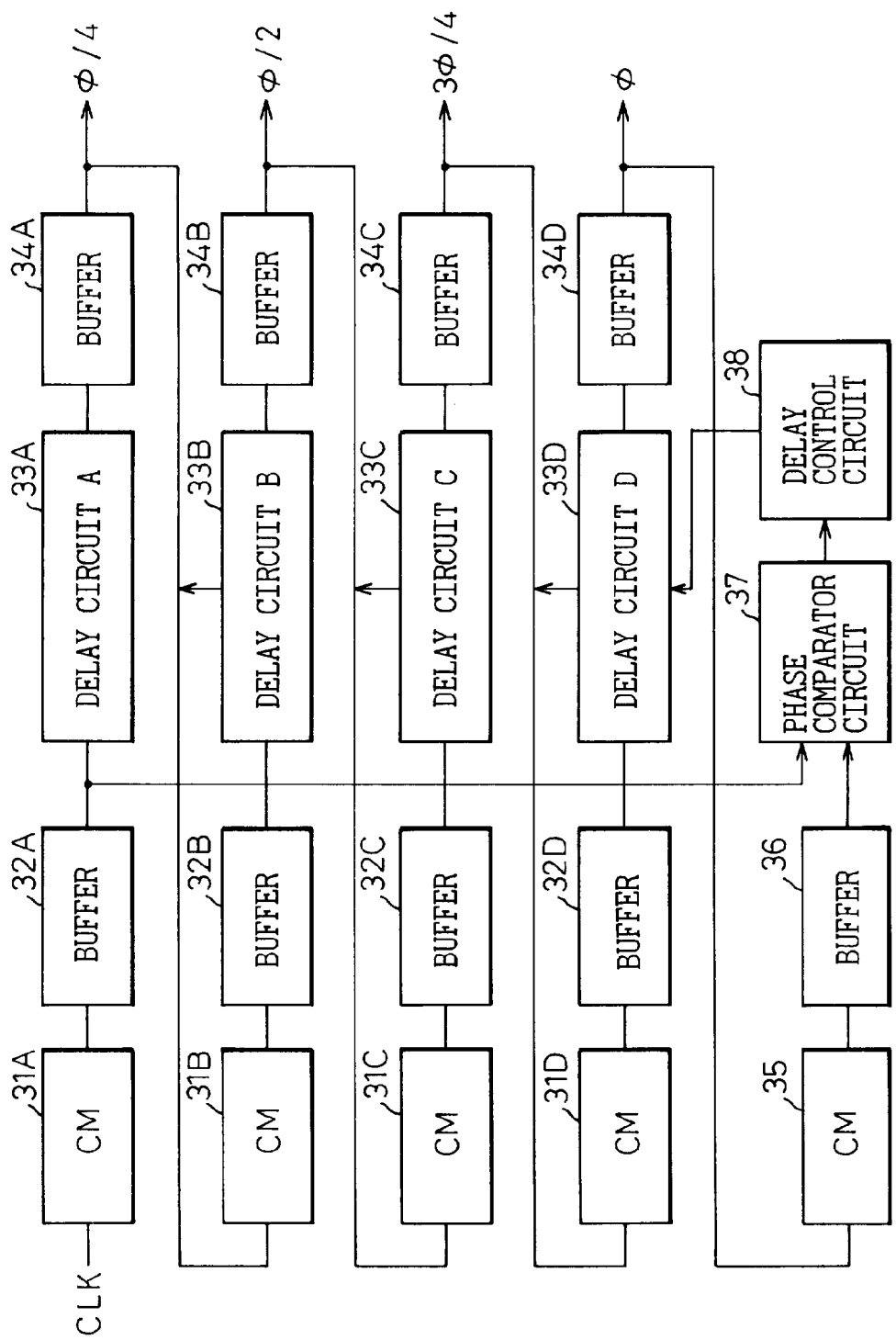
FIG. 7 is a diagram showing a configuration of a clock input/internal clock generating circuit of a controller.

FIG. 7 is a diagram showing a configuration of the clock input/internal clock generating circuit 22. The clock input/internal clock generating circuit 22 is for generating clocks $\phi/4$, $\phi/2$, $3\phi/4$ and $\phi$ exactly one fourth of a period out of phase from the input clock CLK. The input clock CLK is in phase with the generated clock $\phi$. The clock input/internal clock generating circuit 22 includes four series-connected stages each including a set of a current mirror circuit 31, a buffer 32, a delay circuit 33 and a buffer 34 (the respective stages are designated by suffixes A, B, C and D in that order), and is configured in such a manner that the output of a stage is applied to the next stage. The component elements of each stage have the same configuration. Each of the delay circuits is supplied with the same control value from the delay control circuit 38, and therefore the delay amount of each delay circuit is changed at the same time, thus securing the same delay amount for each delay circuit. Also, the output of the buffer 34D in the last stage is applied through a current mirror circuit 35 and a buffer 36 to a phase comparator circuit 37. The current mirror circuit 35 and the buffer 36 also have the same configuration as the current mirror circuit 31 and the buffer 32 in each stage. The phase comparator circuit 37 compares the phase of the output of the buffer 32A in the first stage with that of the buffer 36. On the basis of the comparison result, a delay control circuit 38 changes the delay amount of the delay circuits in such a manner that the phases of the outputs of the buffers 32A and 36 are coincident with each other. When the outputs of the buffers 32A and 36 are in phase with each other, therefore, it follows that the outputs of the respective stages are signals shifted exactly by one fourth of a cycle, thus producing the clocks $\phi/4$, $\phi/2$, $3\phi/4$ and $\phi$ shifted exactly by one fourth of a period. According to this embodiment, the period of change of the data signal is one half of the clock period, and both the data input circuit 24 and the data output circuit 23 retrieve and change the data signal at a timing one fourth of a period out of phase with the leading and trailing edges of the clock, so that a signal one fourth of a period out of phase is generated. In the case where other timings are required, however, the number of stages of the clock input/internal clock generating circuit 22 are determined to meet such a requirement.

Now, the configuration of each memory will be explained.

Figure 8:
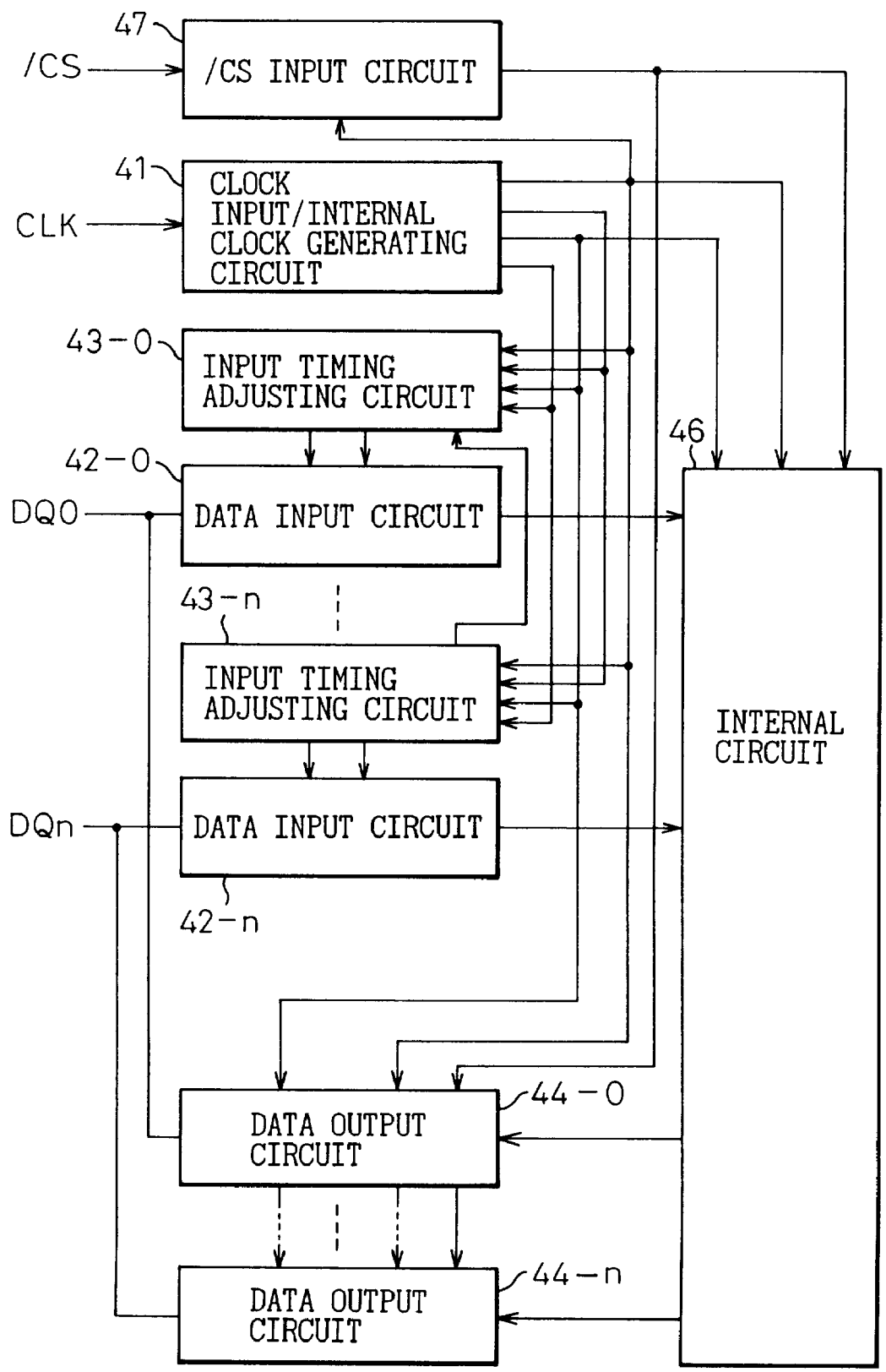
FIG. 8 is a diagram showing a configuration of a memory according to an embodiment.

FIG. 8 is a diagram showing a configuration of the signal input/output section of each memory according to this embodiment. As shown, the signal input/output section includes a clock input/internal clock generating circuit 41 for generating clocks $\phi/4$, $\phi/2$, $3\phi/4$ and $\phi$ shifted by exactly one fourth of a period from the received clock CLK, data input circuits 42-0 to 42-n, input timing adjusting circuits 43-0 to 43-n, data output circuits 44-0 to 44-n, an internal circuit 46 and a /CS input circuit 47. Actually, input circuits for command signals and address signals are also included but not shown. The clock input/internal clock generating circuit 41 can have the same configuration as the corresponding circuit shown in FIG. 7. Each of the data input circuits 42-0 to 42-n and a corresponding one of the input timing adjusting circuits 43-0 to 43-n form a pair in order that each input timing adjusting circuit can independently adjust the input timing of the data signal of the corresponding data input signal. The data output circuits 44-0 to 44-n each output a data signal in synchronism with the clocks $\phi/2$ and $\phi$ shifted by exactly one fourth of a period which are supplied from the clock input/internal clock generating circuit 41. Thus, the data output circuits 44-0 to 44-n produce outputs at the same timing.

The /CS input circuit 47 retrieves a chip select signal /CS. A command signal or an address signal is retrieved by the command signal or address signal input circuit, if selected by the chip select signal /CS, to thereby activate the internal circuit. Also, at the time of write operation, the write data retrieved from the data input circuits 42-0 to 42-n are applied to the internal circuit 46, while at the time of read operation, the read data generated in the internal circuit 46 is output through the data output circuits 44-0 to 44-n. When not selected by the chip select signal /CS, on the other hand, the input circuits of the command signal and the address signal are set not to retrieve these signals or set to retrieve but not to output them to the internal circuit. As a result, the internal circuit remains unchanged. Also, the output from the data output circuits 44-0 to 44-n is set to high impedance. The operation up to this point is similar to the corresponding operation in the prior art. The present embodiment is different from the prior art, however, in that regardless of whether selected or not selected by the chip select signal /CS, a signal from the controller 11 is applied to the signal terminals of the clock input/internal clock generating circuit 41, the data input circuits 42-0 to 42-n and the input timing adjusting circuits 43-0 to 43-n, so that a normal operation is performed in accordance with these signals.

Figure 9:
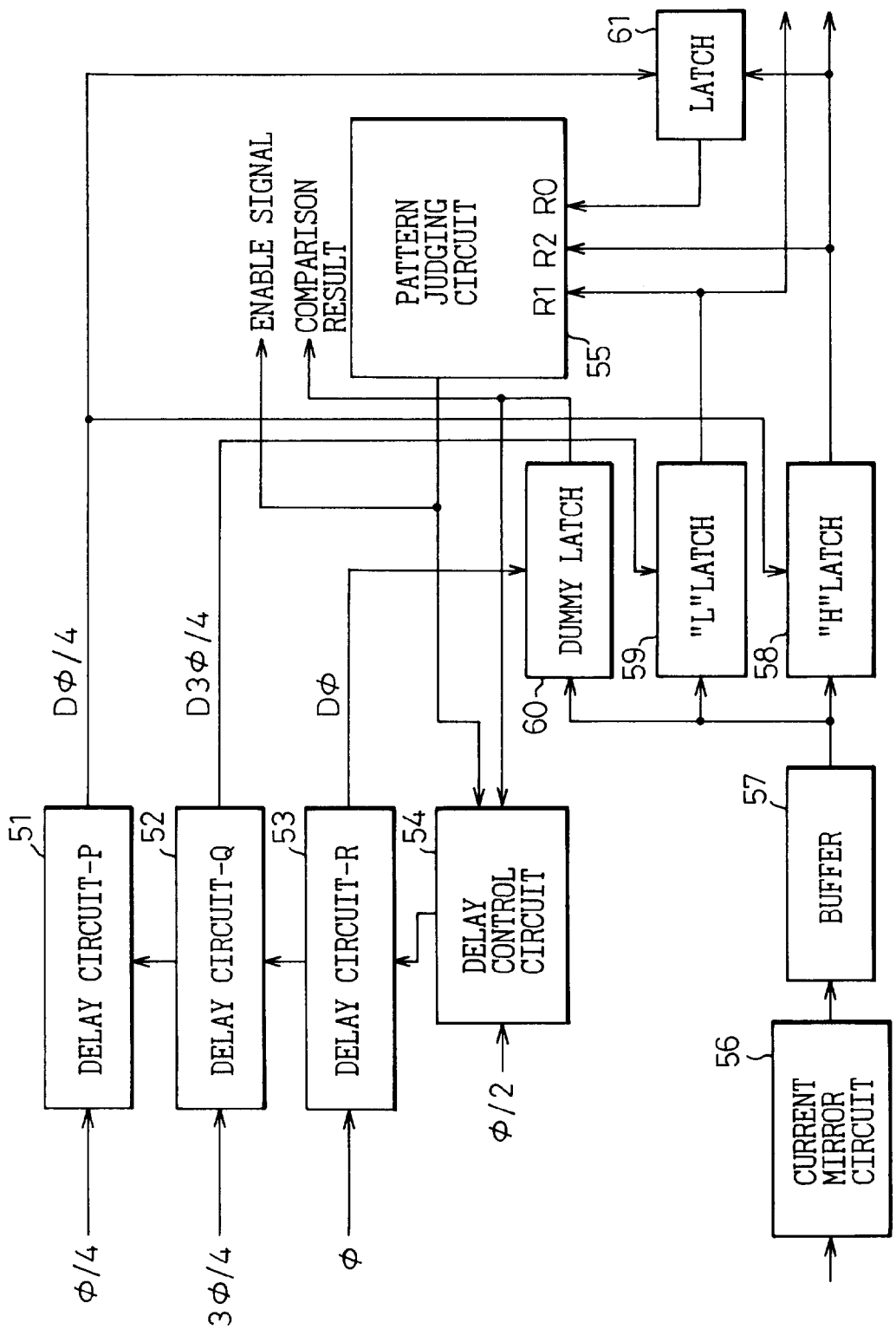
FIG. 9 is a diagram showing a configuration of an input timing adjusting circuit and a data input circuit of a memory.

FIG. 9 is a diagram showing a configuration of the set of a data input circuit and an input timing adjusting circuit. In FIG. 9, a current mirror circuit 56, a buffer 57, a "H" latch circuit 58 and a "L" latch circuit 59 correspond to a data input circuit, and the remaining parts correspond to an input timing adjusting circuit. These circuits have a similar configuration to the corresponding conventional circuits and will not be described. The "H" latch 58 and the "L" latch 59 retrieve input data in synchronism with the delayed clock Dϕ/4 and D3ϕ/4 output from the delay circuit-P 51 and the delay circuit-Q 52, respectively.

First, the processing operation in the input timing adjusting circuit will be described. The input timing adjusting circuit compares the clock ϕ supplied from the clock input/ internal clock generating circuit 41 with the phase of the leading edge of the data signal and, according to the result of the comparison, delays the clock ϕ in such a manner that the clock ϕ and the leading edge of the data signal are in phase with each other. At the same time, the clocks ϕ/4 and 3ϕ/4 are also delayed by the same amount. Thus, as long as the clock Dϕ coincides with the leading edge of the data signal, the leading edges of the clocks Dϕ/4 and D3ϕ/4 are located intermediate to the data signal in a stable state, and therefore can be considered to provide an optimum timing for signal retrieval. Judgement as to whether the leading edge of the clock ϕ is advanced or retarded as compared with the leading edge of the data signal is made by actually retrieving the data signal with the clock Dϕ upon detection that the data signal changes according to a predetermined pattern and by judging the value of the change.

For the purpose of performing the above-mentioned operation, the input timing adjusting circuit includes a delay circuit-P 51 for delaying the clock ϕ/4, a delay circuit-Q 52 for delaying the clock 3ϕ/4, a delay circuit-R 53 for delaying the clock ϕ, a delay control circuit 54, a pattern judging circuit 55, a dummy latch 6 and a latch 61.

Figure 10:
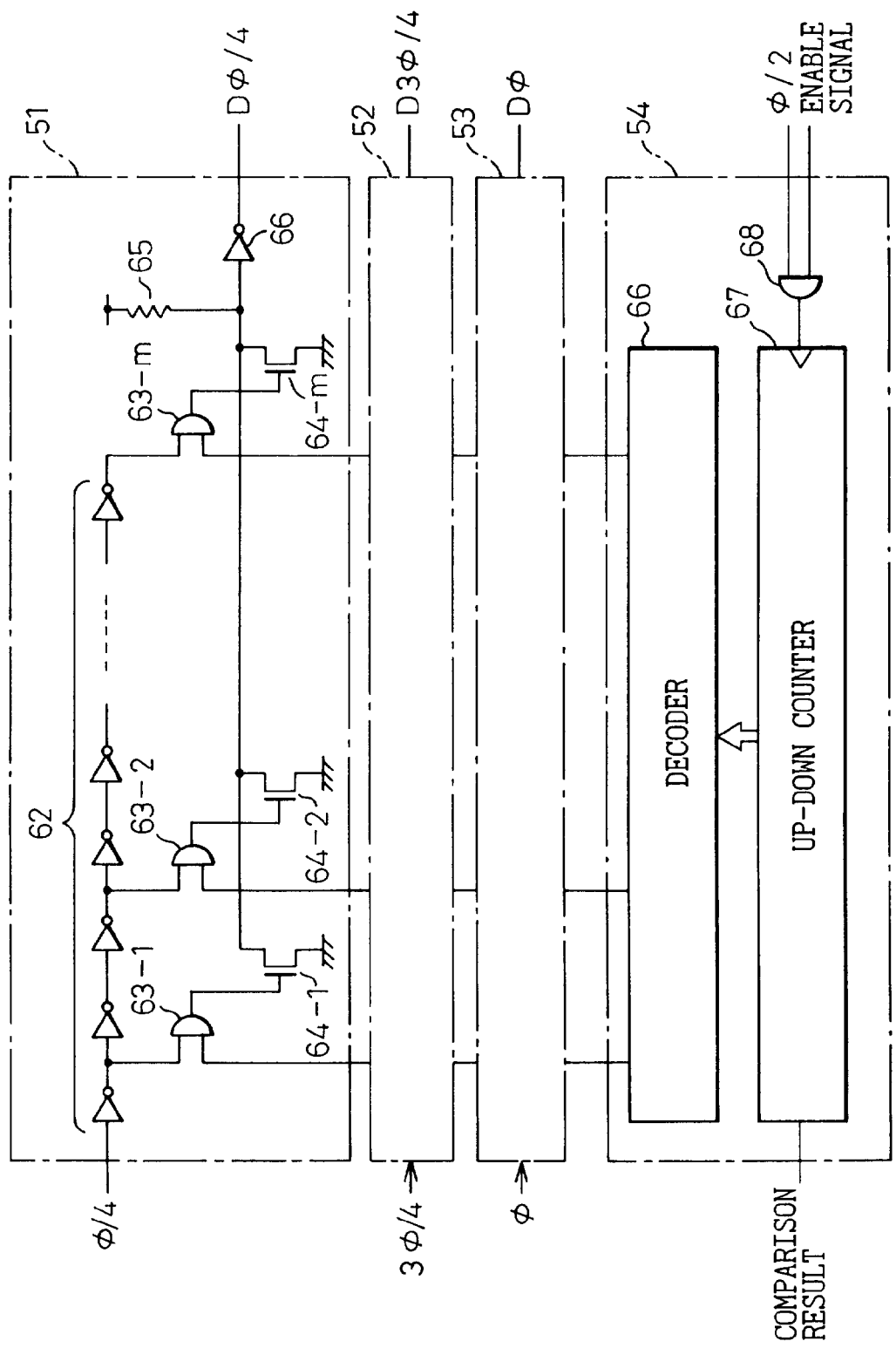
FIG. 10 is a diagram showing a configuration of a delay circuit and a delay control circuit used with the input timing adjusting circuit.

FIG. 10 is a diagram showing a configuration of the delay circuit-P 51, the delay circuit-Q 52, the delay circuit-R 53 and the delay control circuit 54. The delay circuit-P 51, the delay circuit-Q 52 and the delay circuit-R 53 have the same configuration and are controlled to the same delay amount by the delay control circuit 54. As shown in the diagram, each of the delay circuits includes an inverter string 62 having a plurality of inverters connected in series, an AND gate string including a plurality of AND gates 63-1, 63-2, . . . , 63-m each arranged in such a manner that one of the input terminals thereof receives the output of every other stage of the inverter string 62, a transistor string including a plurality of N-channel transistors 64-1, 64-2, . . . , 64-m with the gates thereof impressed with the outputs of the AND gates respectively, with the sources thereof grounded and with the drains thereof connected in common, a resistor 65 inserted between a signal line connected with the drains of the N-channel transistors and the high potential side of a power supply, and a buffer 66 with the input terminal thereof connected to the signal line for producing a delayed clock. The delay control circuit 54 includes an up-down counter 67 for switching between the count-up and count-down operations in accordance with the judgement produced by the dummy latch 60, and a decoder 66 for decoding the output of the up-down counter 67. The up-down counter 67 performs the counting operation when the enable signal produced from the pattern judging circuit 55 is valid when the clock ϕ/2 rises. In accordance with the value of the comparison result at such a time, the up-down counter 67 performs either the count-up or the count-down operation. The decoder 66 sets one of the outputs thereof to "H" and the other outputs thereof to "L" in accordance with the output of the up-down counter 67. In the case where the up-down counter 67 counts up, the "H" output position is shifted rightward, while in the case where the up-down counter 67 counts down, the "H" output position is shifted leftward. The outputs of the decoder 66 are connected to the other input terminal of each of the AND gates 63-1, 63-2, . . . , 63-m respectively, and only the AND gate supplied with the "H" signal from the decoder 66 is activated. Among the output signals of the inverter string, the signal applied to the activated AND gate is output as the delayed clocks Dϕ/4, D3ϕ/4, Dϕ. The number of stages of the inverter string affected is varied depending on a particular AND gate activated, thereby making it possible to select the delay amount of the internal clock. As will be seen, the adjustment unit for controlling the delay amount corresponds to two inverters. The configuration shown in FIG. 10 is usable for the delay circuits and the delay control circuit shown in FIG. 7.

The clocks ϕ/4 and 3ϕ/4 applied to the delay circuit-P 51 and the delay circuit-Q 52, respectively, are signals displaced exactly by one fourth of a period from the clock ϕ applied to the delay circuit-R 53. The delay circuit-P 51, the delay circuit-Q 52 and the delay circuit-R 53 have the same configuration and are controlled to the same delay amount by the delay control circuit 54. The clocks output from the delay circuit-P 51 and the delay circuit-Q 52, therefore, are signals out of phase with the clock output from the delay circuit-R 53 exactly by ϕ/4 and 3ϕ/4, respectively.

Figure 11:
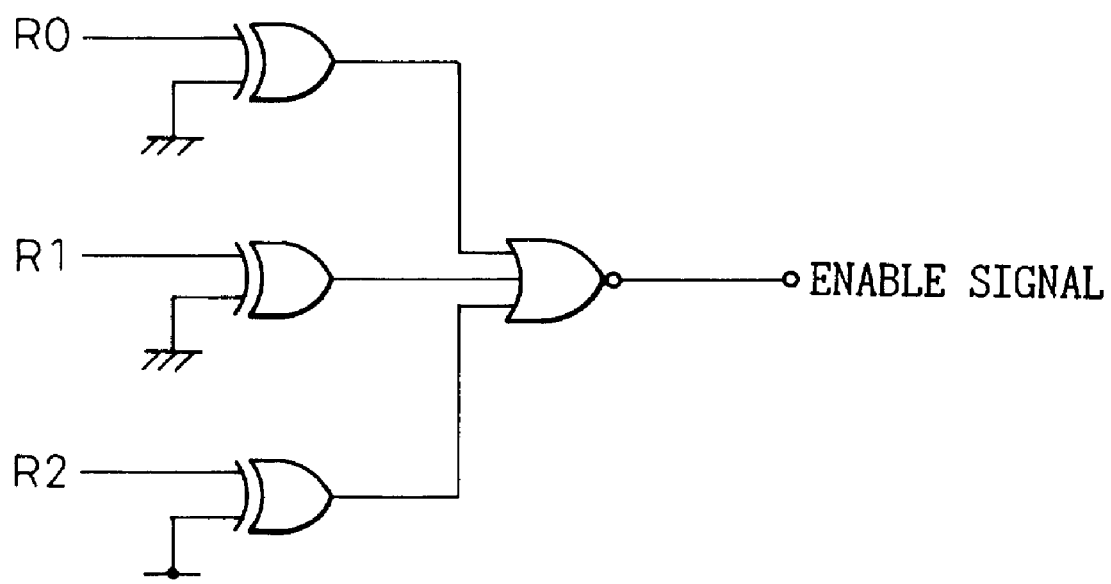
FIG. 11 is a diagram showing a configuration of a pattern judging circuit used with an input timing adjusting circuit.

FIG. 11 is a diagram showing a configuration of the pattern judging circuit 55. As described above, according to this embodiment, the phase is judged when the input signal changes in a predetermined pattern, or specifically, from "L" to "L" to "H", and at the same time when the transition from "L" to "H" coincides with the leading edge of the clock ϕ. It is therefore necessary to judge whether the input signal has this pattern or not. This judgement uses the output R2 of the "H" latch 58 and the output R1 of the "L" latch 59 of the data input circuit and the output R0 of the latch 61 for holding the output of the "H" latch 58 during the next clock cycle. In the case where R0, R1 and R2 are "L", "L" and "H", respectively, the intended pattern is judged to exist. As shown in FIG. 11, therefore, whether R0, R1 and RT2 are "L", "L" and "H", respectively, or not is judged using exclusive-OR gates, and when the conditions in all the exclusive-OR gates are met, an enable signal is generated. The phase is compared and the delay amount is adjusted only in association with a predetermined pattern as described above is by reason of the fact described below. Specifically, the data signal changes for every transition period in some cases or maintains the same state for several transition periods in other cases. In a high-speed system with a very high clock frequency, the optimum retrieval timing is varied between when the input data changes for every transition period and when the input data changes after continuing to maintain the same value for several transition periods. The amount of adjustment is different between these cases. The resulting fluctuation of the adjustment value is not desirable. In this embodiment, therefore, the phase is judged and the delay circuit is adjusted only in association with a predetermined pattern as described above.

Returning to FIG. 9, when an enable signal is generated as described above, the input data has changed from "L" to "H" at about the leading edge immediately before the clock φ. When the dummy latch 60 retrieves the input data in synchronism with the clock φ, therefore, the clock φ is delayed behind the input data if the latter is "L", while the clock φ leads the input data if the latter is "H". The value on the dummy latch 60 thus provides the result of phase comparison.

Figure 12:
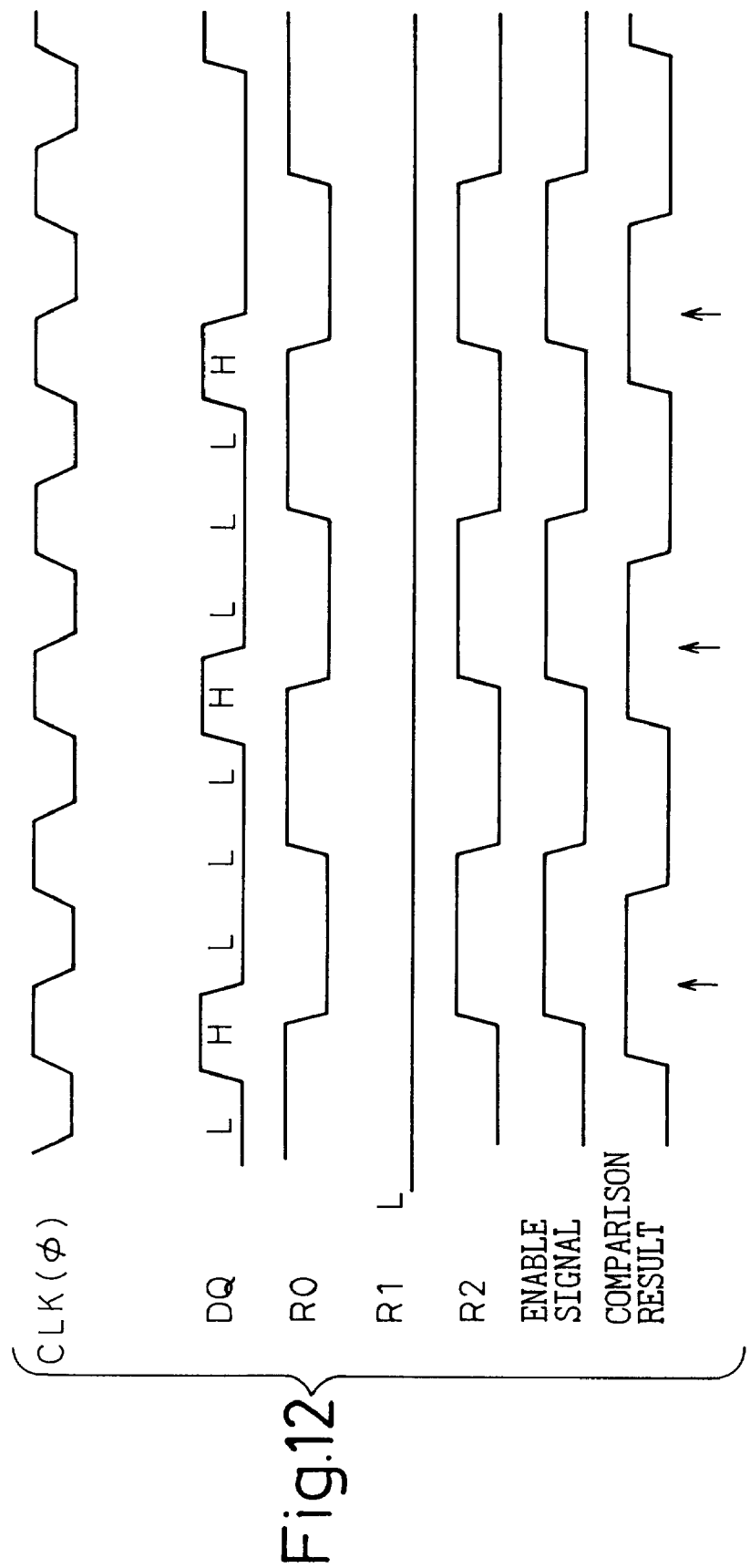
FIG. 12 is a time chart showing the pattern judging operation and the adjusting operation.

FIG. 12 is a time chart showing the result of pattern judgement and phase comparison and the associated adjusting operation according to an embodiment. In the receive timing adjust mode, the controller 11 outputs the data changing in a pattern of "L", "L", "L", "H" as shown, generated by the dummy data generating circuit 25, and the memories adjust the input timing with this data. In the memories, the data input circuits retrieve an input signal at the leading edges of the clocks φ/4 and 3φ/4, and therefore, the input data is required to be adjusted to change at the leading edge of φ or φ/2. In the case under consideration, the edge of transition from "L" to "H" of the data having the above-mentioned pattern is adjusted to coincide with the leading edge of φ. In FIG. 12, the input data DQ is shown to lead φ somewhat. R0, R1, R2 change as shown, and the enable signal also changes as shown. The comparison result providing the value of the dummy latch changes as shown. The output of the up-down counter 67 of the delay control circuit 54 changes in accordance with the comparison result at the leading edge of the clock φ/2 when the enable signal is valid, and thus changes at the positions indicated by arrows in the diagram.

Figure 13:
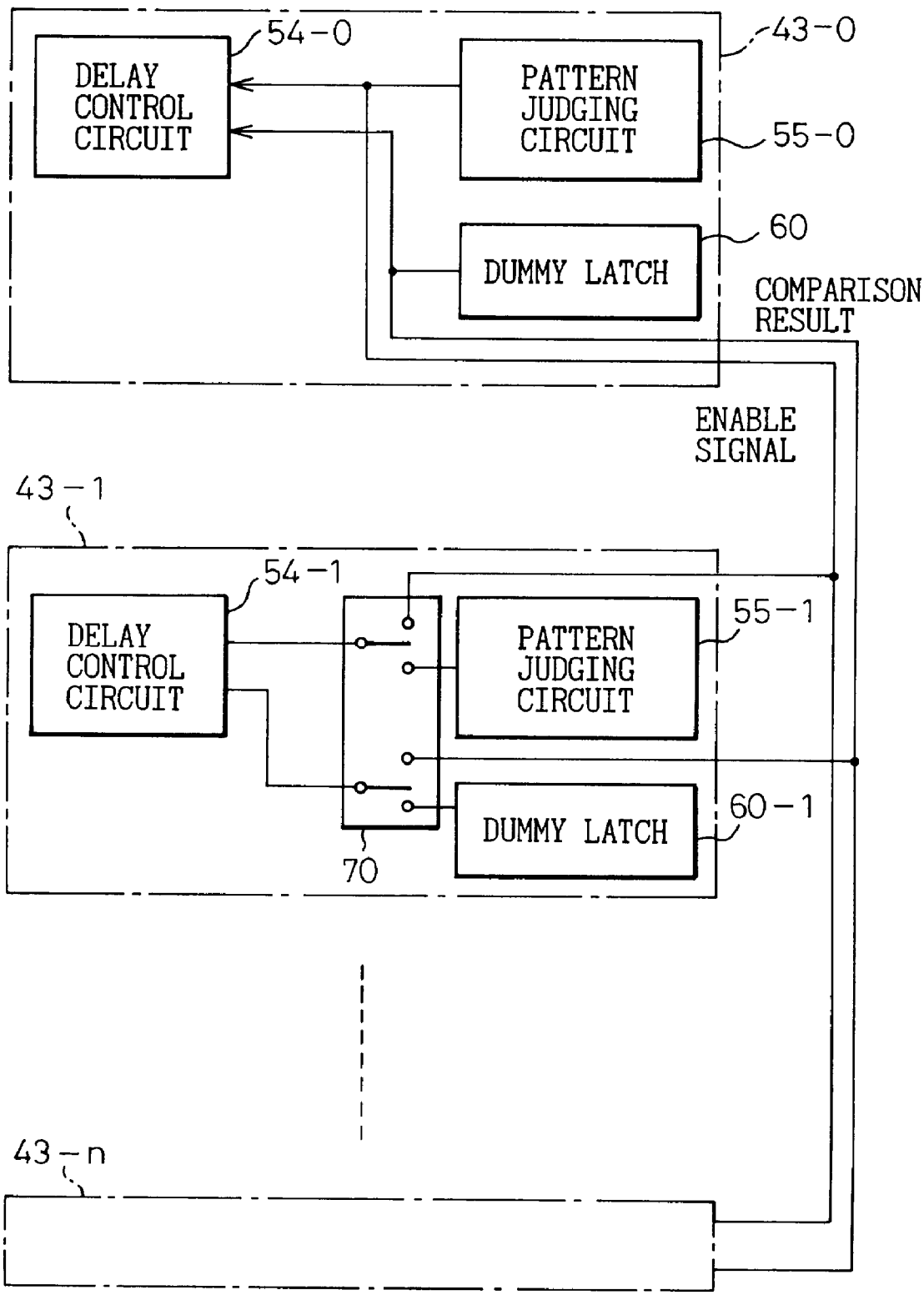
FIG. 13 is a diagram showing the relationship between a plurality of input timing adjusting circuits.

In normal operation mode after receive timing adjust mode, the controller 11 outputs the data to be written into the memories. The write data does not necessarily have the above-mentioned pattern. As long as a multiplicity of data patterns are output, however, the signal may change from "L" to "L" to "H", and the transition edge from "L" to "H" may occur in the neighborhood of the leading edge of φ. In such a case, the enable signal output from the pattern judging circuit 55 is validated, and the up-down counter 67 of the delay circuit 54 is changed in accordance with the comparison result at the dummy latch 60. FIG. 13 is a diagram showing a general configuration of the input timing adjusting circuits 43-0 to 43-n. Each input timing adjusting circuit has a substantially similar configuration. The input timing adjusting circuits 43-1 to 43-n except for the first input timing adjusting circuit 43-0, however, have a switch 70 for determining whether the delay control circuit 54-1 is to be supplied with the enable signal and the comparison result generated internally or with the enable signal and the comparison result generated in the input timing adjusting circuit 43-0. The switch 70 is operated in such a manner as to supply the enable signal and the comparison result generated internally in receive timing adjust mode and to supply the enable signal and the comparison result generated in the input timing adjusting circuit 43-0 in normal operation mode. Each data signal line cannot be connected with the same load at exactly the same wiring length, and therefore some skew exists between write data. In timing adjust mode, therefore, each delay circuit is adjusted to an optimum timing in accordance with the skew developed for each input data thereto. The input timing is adjusted also in normal operation mode in view of the fact that the optimum retrieval timing varies with the environmental conditions such as the source voltage and the temperature. A similar fluctuation is expected to occur in each input data circuit. In normal operation mode, therefore, the phase is judged for a representative data input circuit and a corresponding input timing adjusting circuit, and the delay amount of the delay circuit for the remaining circuits is adjusted using the result of the phase judgement for the representative data input circuit. With this configuration, the phase judging circuits of the other input timing adjusting circuits can be deactivated, thus reducing the power consumption.

Figure 14:
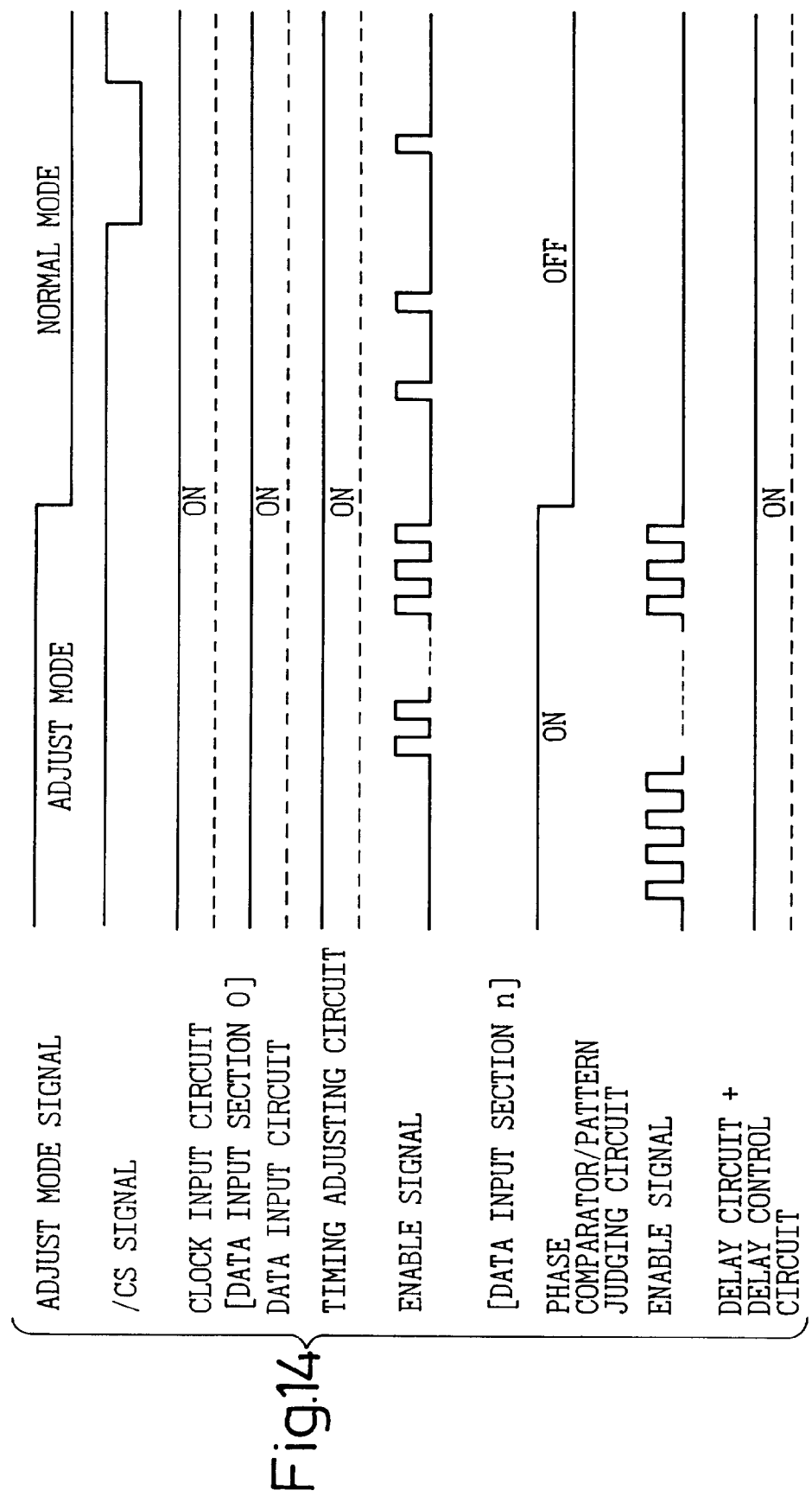
FIG. 14 is a time chart showing the operation in each mode according to an embodiment.

FIG. 14 is a time chart showing the operation of each circuit in the receive timing adjust mode and in the normal operation mode according to an embodiment. Which mode is involved, the receive timing adjust mode or the normal operation mode, is indicated to each memory from the controller 11 using a dedicated signal line and a dedicated terminal or by a combination of command signals. In the timing adjust mode, the memories are not supplied with the /CS signal. As shown, regardless of the timing adjust mode or the normal operation mode, the clock input circuit is activated. Each data input circuit-0 and each input timing adjusting circuit-0 are also in operation regardless of the timing adjust mode or the normal operation mode, so that the input timing is always adjusted. Also, the phase comparison function and the pattern judging circuit of the input timing adjusting circuits other than the input timing adjusting circuit-0 are deactivated, and neither an enable signal nor a comparison output are produced in the normal operation mode.

In the input timing adjust mode, on the other hand, the controller 11 outputs a predetermined pattern as shown in FIG. 12. The input timing adjusting circuits from the circuit-0 to the circuit-n compare the phase and judge the pattern, so that the enable signal alternates between valid and invalid states for each clock cycle. Consequently, in the timing adjust mode, the input timing is adjusted in minimum cycles, and thus the time required for adjustment can be reduced as compared with the time of a random pattern input. The time for which the timing adjust mode lasts is set to such a length that the phase shift, if maximum, between the clock and the input data in the initial state can be adjusted to achieve coincidence between them.

In the normal operation mode, the input timing adjusting circuit-0 generates an enable signal when the write data output by the controller 11 onto the data bus has a predetermined pattern. An enable signal is thus generated at random. This operation is performed even when a particular memory is not selected, i.e., even when the /CS signal is in non-select mode. The enable signal and the comparison result generated in the input timing adjusting circuit-0 are applied to the delay control circuit-0 as well as the delay circuits including the delay circuit-1 to the delay circuit-n of the other input timing adjusting circuits thereby to adjust the delay amount of the delay circuits.

Figure 15:
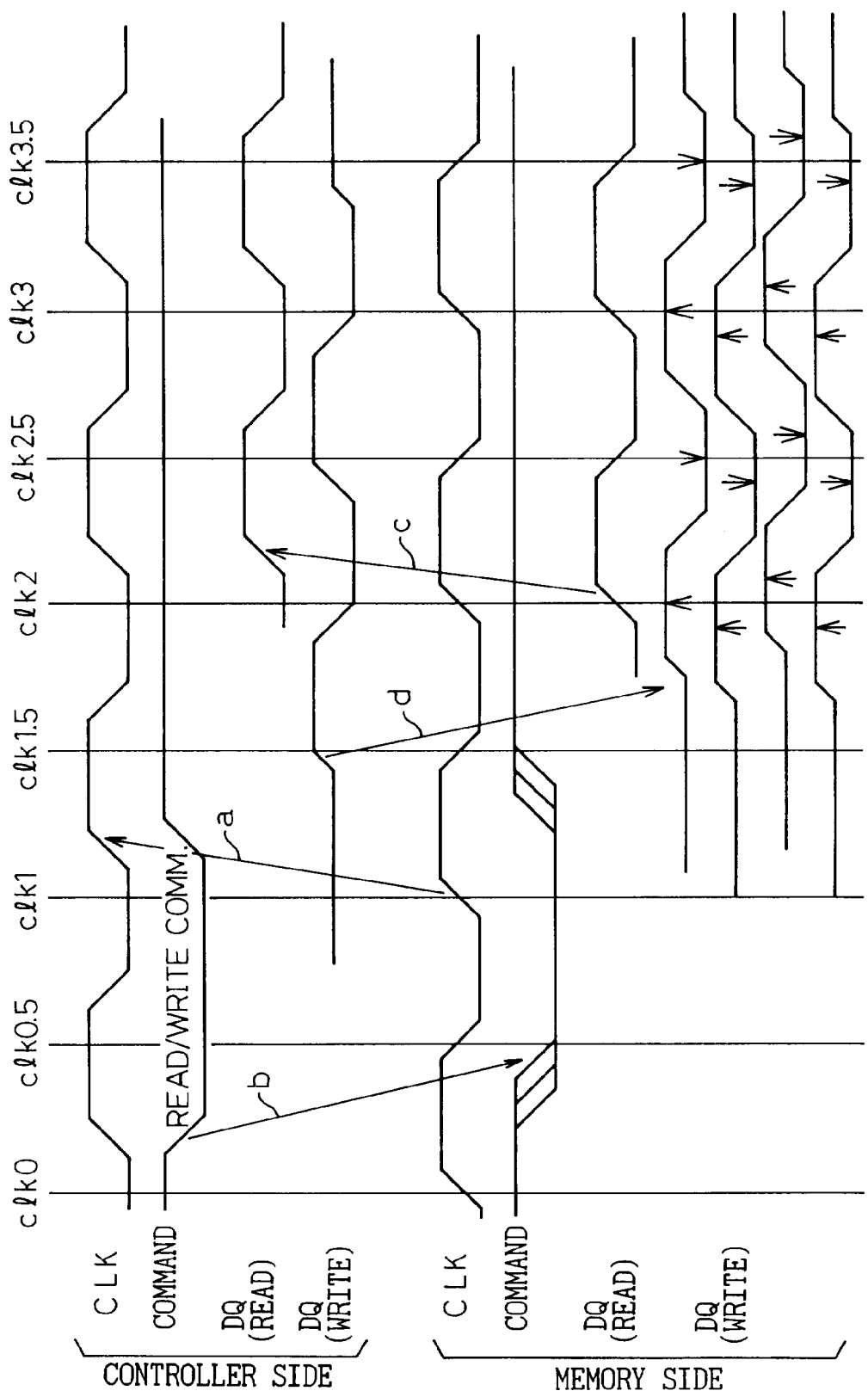
FIG. 15 is a time chart showing the read/write operations according to an embodiment.

FIG. 15 is a time chart showing the read/write operation in the controller 11 and the memories according to this embodiment. The clock CLK applied to the memories, as indicated by a, arrives at and is retrieved by the controller 11 in a state delayed by the time required for transmission to the controller 11. The command signal from the controller 11 to the memories changes in synchronism with the leading edge of the clock CLK of the controller 11 and is transmitted to the memories as indicated by b. The phase of the command signal as of the time point when it has reached the memories is displaced from the phase of the clock received by the memories. In addition, the displacement is varied with the memory position. As shown, however, the transition period of the command signal is longer than that of the data signal, and therefore such a displacement poses no problem. The data read from the memories are output in synchronism with the leading edge and the trailing edge of the clock. The read data are transmitted to the controller 11 in the same manner as the clock. In the controller 11, therefore, the read data and the clock are in phase with each other. The read data can thus be retrieved with the clocks $\phi/4$ and $3\phi/4$. The write data, on the other hand, change at the edges of the clocks $\phi/4$ and $3\phi/4$ in the controller 11. Since the write data are transmitted in the direction opposite to the clock, however, the write data that have arrived at the memories are totally out of phase with the clock. The write data thus are adjusted for each memory or for each data signal in the memories independently of each other. As a result, the timing of retrieving the write data varies from one memory to another and, in each memory, from one data signal to another.

It will thus be understood from the foregoing description that according to the present invention, a semiconductor device system is provided, wherein the read and write operations can be performed at a proper timing without increasing the number of the clock types or the amount of the associated wiring.

What is claimed is:

1. A semiconductor device system comprising:
    a plurality of semiconductor devices operated in synchronism with a clock, one of said semiconductor devices operating as a drive-side semiconductor device for producing a signal related to the control of the remaining semiconductor devices; and
    a clock signal line for transmitting said clock to each of said semiconductor devices, said clock signal line being arranged in parallel with other signal lines;
    wherein said drive-side semiconductor device includes an input circuit for retrieving signals from said remaining semiconductor devices other than said drive-side semiconductor device in synchronism with said clock and an output circuit for producing an output signal in synchronism with said clock, and
    each of the remaining semiconductor devices other than said drive-side semiconductor device includes an output circuit for producing an output signal in synchronism with said clock, an input circuit for retrieving a signal from said drive-side semiconductor device, and an input timing adjusting circuit for adjusting the retrieval timing of said input circuit.

2. A semiconductor device system according to claim 1, wherein said input timing adjusting circuit includes:
    a delay circuit for delaying an internal clock generated on the basis of said received clock and producing said internal clock as an input timing clock, the amount of delay of said internal clock being selectable;
    a phase comparator circuit for judging the phase of said input timing clock and an input signal; and
    a delay control circuit for changing the delay amount of said delay circuits in such a manner that said input timing clock has a predetermined phase relation with said input signal on the basis of the result of judgement by said phase comparator circuit.

3. A semiconductor device system according to claim 1, wherein
    a predetermined length of time after activating said semiconductor device system is set as a receive timing adjust mode for adjusting said input timing adjusting circuit, said receive timing adjust mode being followed by a normal operation mode in which said input timing adjusting circuit can be adjusted.

4. A semiconductor device system according to claim 1, wherein
    said input timing adjusting circuit includes a pattern judging circuit for judging that an input signal has a predetermined pattern and adjusting the retrieval timing of said input circuit when said input signal has said predetermined pattern.

5. A semiconductor device system according to claim 3, wherein
    said input timing adjusting circuit includes a pattern judging circuit for judging that an input signal has a predetermined pattern, and is adapted to adjust the retrieval timing of said input circuit when said input signal has said predetermined pattern, and
    said drive-side semiconductor device produces the signal having said predetermined pattern in the receive timing adjust mode.

6. A semiconductor device system according to claim 1, wherein,
    said semiconductor devices other than said drive-side semiconductor device each include an input terminal supplied with a select signal indicating that said particular semiconductor device is selected as an object of access from said drive-side semiconductor device,
    when said select signal is supplied to said input terminal, the signal input to said semiconductor device is retrieved and processed in an internal circuit and an output signal is produced as required, and
    when said select signal is not supplied to said input terminal, said input timing adjusting circuit and a circuit required for processing in said input timing adjusting circuit are activated but the input signal is not transmitted to said internal circuit.

7. A semiconductor device system comprising:
    a plurality of receive-side semiconductor devices; and
    a drive-side semiconductor device for producing a signal related to the control of said receive-side semiconductor devices;
    wherein said receive-side semiconductor devices and said drive-side semiconductor device operate in synchronism with a clock, and
    each of said receive-side semiconductor devices includes an input circuit for retrieving a signal from said drive-side semiconductor device, an input timing adjusting circuit for adjusting the retrieval timing of said input circuit and a terminal supplied with a select signal indicating that said particular receive-side semiconductor device is selected as an object of access,
    when said select signal is supplied to said terminal, the signal input to said semiconductor device is retrieved and processed in an internal circuit and an output signal is produced as required, and when said select signal is not supplied to said terminal, said input timing adjusting a circuit and a circuit required for processing in said input timing adjusting circuit are activated but the input signal is not transmitted to said internal circuit.

8. A semiconductor device comprising:

a clock input circuit for receiving a clock;

an output circuit for producing an output signal in synchronism with said clock;

an input circuit for retrieving an input signal in response to an input timing clock; and an input timing adjusting circuit having a variable delay circuit for delaying said clock to produce said input timing clock having a predetermined phase relation with said input signal.

9. A semiconductor device according to claim 8, wherein said input timing adjusting circuit further includes:

a phase comparator for comparing phases of said clock and said input timing signal; and a delay control circuit for controlling a delay time in said variable delay circuit in response to a comparison result of said phase comparator.

10. A semiconductor device according to claim 8, wherein said input timing adjusting circuit includes a pattern judging circuit for judging that an input signal has a predetermined pattern, and means for adjusting the retrieval timing of said input circuit when said input signal has said predetermined pattern.

11. A semiconductor device according to claim 8, further comprising a terminal supplied with a select signal indicating said semiconductor device has been selected as an object of access;

wherein, when said select signal is supplied to said terminal, the signal input to said semiconductor device is retrieved and processed in an internal circuit and an output signal is produced as required, and when said select signal is not supplied to said terminal, said input timing adjusting circuit and a circuit required for processing in said input timing adjusting circuit are activated but the input signal is not transmitted to said internal circuit.

12. A semiconductor device according to claim 9, comprising a mode resistor/decoder for recognizing a mode indication signal for indicating the receive timing adjust mode of the input signal.

13. A semiconductor device according to claim 12, comprising a plurality of said input circuits corresponding to a plurality of data signals, each of said input circuits including said input timing adjusting circuit.

14. A semiconductor device according to claim 13, wherein some of said input timing adjusting circuits each include a switch for switching between the result of judgement output from said phase comparator circuit of said particular input timing adjusting circuit and the result of judgement output from the phase comparator circuits of the other input timing adjusting circuits as said result of judgement supplied to said delay control circuit, and said switch is adapted to switch for supplying said delay control circuit with the result of judgement output from said phase comparator circuit of said particular input timing adjusting circuit in said receive timing adjust mode and with the result of judgement output from said phase comparator circuit of said other input timing adjusting circuits in other than said receive timing adjust mode.

* * * * *